United States Patent
Chait et al.

(10) Patent No.: US 9,618,535 B2
(45) Date of Patent: Apr. 11, 2017

(54) TEST INSTRUMENT PROBE WITH A POINTED TIP THAT IS ALSO CAPABLE OF GRIPPING

(71) Applicants: Paul Nicholas Chait, San Rafael, CA (US); Stanley Chait, New York, NY (US)

(72) Inventors: Paul Nicholas Chait, San Rafael, CA (US); Stanley Chait, New York, NY (US)

( * ) Notice: Subject to any disclaimer, the term of this patent is extended or adjusted under 35 U.S.C. 154(b) by 16 days.

(21) Appl. No.: 14/474,265

(22) Filed: Sep. 1, 2014

(65) Prior Publication Data
US 2016/0061888 A1 Mar. 3, 2016

Related U.S. Application Data

(60) Provisional application No. 61/872,222, filed on Aug. 30, 2013.

(51) Int. Cl.
| | | |
|---|---|---|
| *G01R 31/02* | (2006.01) | |
| *G01R 1/067* | (2006.01) | |
| *B25B 9/02* | (2006.01) | |
| *G01R 1/04* | (2006.01) | |

(52) U.S. Cl.
CPC ............ *G01R 1/06788* (2013.01); *B25B 9/02* (2013.01); *G01R 1/0416* (2013.01); *G01R 1/0425* (2013.01)

(58) Field of Classification Search
CPC .................................................. G01R 1/06788
USPC ... 324/754.02, 754.03, 72.5, 754.12, 754.14; 439/482
See application file for complete search history.

(56) References Cited

U.S. PATENT DOCUMENTS

| 2,522,810 A | | 9/1950 | Bailey | |
|---|---|---|---|---|
| 2,641,630 A | * | 6/1953 | Goldberger | ........ G01R 1/06788 174/88 R |
| 2,918,646 A | | 12/1959 | Davidson | |
| 3,182,257 A | * | 5/1965 | Linkowski | ......... G01R 1/06788 324/149 |

(Continued)

OTHER PUBLICATIONS

Alligator clips ECG, http://www.kappamedical.com/alligator_clips_ecg.htm, Feb. 1, 2001.*

*Primary Examiner* — Patrick Assouad
*Assistant Examiner* — Demetrius Pretlow
(74) *Attorney, Agent, or Firm* — Larry D. Johnson

(57) ABSTRACT

A test instrument probe that encompasses the dual alternate action of a point or a clamp-grip within the same probe. This probe has approximately the same dimensions as a conventional probe, and allows either the point or clamp action to be used without the necessity of removing the probe from the hand. This alternate action requires only using a thumb and finger pressure to change from a point to a clamp or the clamp to a point. One embodiment allows a clamp jaw opening of up to a nominal ¼ inch that is usually sufficient to grip onto the leads of an electronic component such as resistor, capacitor or integrated circuit pin. The probes are also designed so that when not in use, the two probes can be connected together by a snap-in action that minimizes the potential loss of a probe and importantly allows the points to become safely enclosed to minimize a sharp point hazard.

11 Claims, 8 Drawing Sheets

(56) References Cited

U.S. PATENT DOCUMENTS

| | | | | |
|---|---|---|---|---|
| 3,612,999 A | * | 10/1971 | Bergero | G01R 1/06788 324/125 |
| 4,151,462 A | * | 4/1979 | Teyler | G01R 1/06788 324/72.5 |
| 4,243,285 A | * | 1/1981 | Crowley | H01R 13/35 439/219 |
| 6,980,417 B2 | * | 12/2005 | Chang | G01R 1/06788 324/755.01 |
| 7,298,136 B1 | * | 11/2007 | Curtis | G01R 31/2834 324/754.03 |
| 7,902,848 B2 | | 3/2011 | Eccleston | |
| 8,922,196 B2 | * | 12/2014 | Chait | G01R 1/07307 324/149 |
| 2005/0057243 A1 | * | 3/2005 | Johnson | G01R 19/16561 324/754.02 |
| 2010/0060303 A1 | * | 3/2010 | Beckmann | G01R 31/006 324/750.01 |
| 2015/0072572 A1 | * | 3/2015 | Easterling | H01R 11/24 439/863 |

* cited by examiner

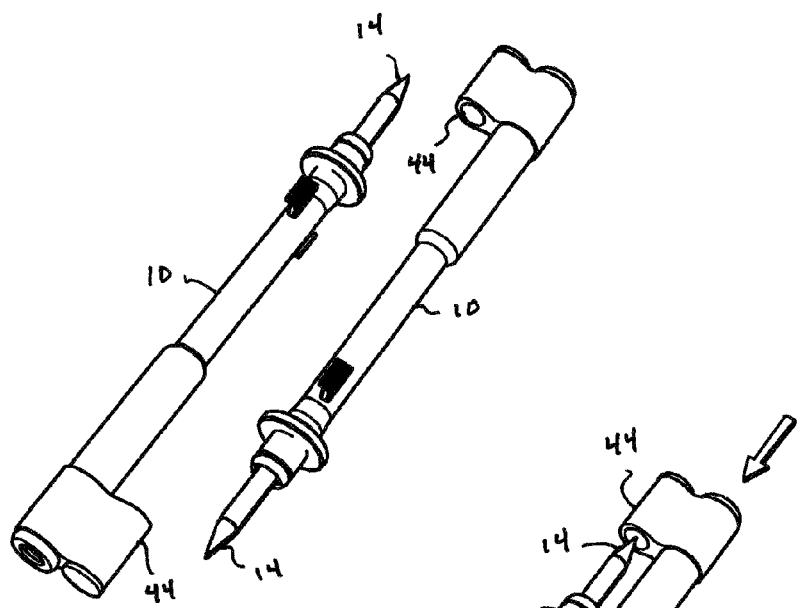
FIG. 8A
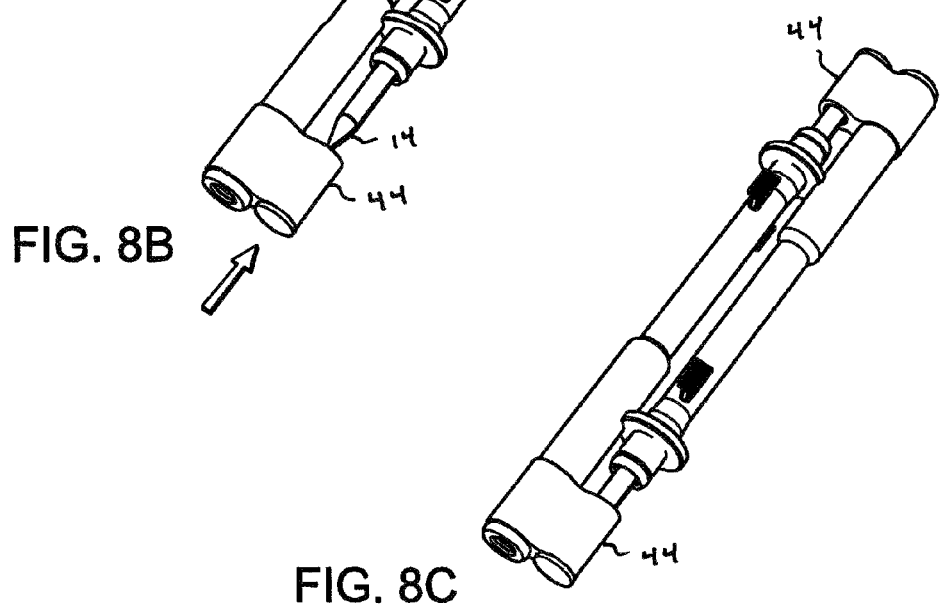
FIG. 8B
FIG. 8C

TEST INSTRUMENT PROBE WITH A POINTED TIP THAT IS ALSO CAPABLE OF GRIPPING

CROSS REFERENCE TO RELATED APPLICATIONS

The present application claims the benefit of the filing date of U.S. Provisional Patent Application Ser. No. 61/872,222, filed Aug. 30, 2013. The foregoing application is incorporated by reference in its entirety as if fully set forth herein.

STATEMENT REGARDING FEDERALLY SPONSORED RESEARCH OR DEVELOPMENT

REFERENCE TO A MICROFICHE APPENDIX

Not applicable.

TECHNICAL FIELD

The present invention relates generally to electrical test instrument probes, and more particularly, to a test instrument probe with a pointed tip that is also capable of gripping.

BACKGROUND INFORMATION AND DISCUSSION OF RELATED ART

Probes for electrical test instruments such as those known as multi-meters or volt-ohmmeters are a necessary adjunct to most instruments during any testing procedure. The most common interface between the 'Device Under Test' (DUT) and the multi-meter is a pointed metallic tip of a probe. The overall length of a conventional probe consists of a pointed shaft and plastic tube-type of enclosure that is usually about 4 to 5 inches long overall, with the tube ½ inch in diameter, and point shaft ¾ inch long and $3/32^{nd}$ inch in diameter. The user of the probe can contact the DUT with the tip of the point and at the rear of the probe enclosure is either a socket for the lead wire to the multi-meter, or the lead wire is embedded in the tube.

Using two probes allows a multi-meter to read the functions selected by a setting on the multi-meter such as AC or DC volts, amperes, Ohms, frequency, and many other readings as required. The two probes routinely used for electrical and electronic testing require one probe to be held in each hand. One probe, for example, would read the positive DC volts and the other probe reads the negative DC volts to be displayed on the multi-meter.

There are times during testing where it is desirable that one or both of the probes tips, in addition to contacting the DUT with its pointed tip, can also grip onto a lead wire or small terminal of the DUT and remains gripped until released. There are also times when a continuous reading of a function is required and therefore both probes should be used as grips.

Conventional probes are available that have either a point tip or clamp-type of tip, also known as a 'clip' or 'alligator clip' and some point probes are provided with a separate clip that can be attached to the point. However, attaching the clip is time consuming and can interrupt the concentration and integrity of the testing procedure. A clip is often lost or if a point probe is needed instead of a clamp the point probe may be unavailable. This can lead to the use of the incorrect probe for the test application, with possible damage to the DUT or harm to the user.

Some prior patents provide background to the present invention. For example, U.S. Pat. No. 2,522,810 to Bailey discloses an insulated electrical connector comprising a pair of insulated, spring loaded pivoted jaws.

U.S. Pat. No. 2,918,646 describes a convertible test probe adapted for effecting electrical test contact either by clipping, probing, or sliding contact.

U.S. Pat. No. 4,151,462 to Teyler teaches an electrical test probe having a spring biased clip with an extendable and retractable tip movable within the clip. The normally refracted tip is extendible intermediate spring biased jaws of the electrical probe and is retained in the extended position by a spring bias and the gripping action of the jaws. The housing for the probe includes a compartment for containing interchangeable active or passive circuitry operative upon the signal sensed by the probe or a signal injected thereto from the probe. Apparatus for checking the electrical continuity through the probe is also disposed within the housing. A socket which provides both electrical and structural interconnection between the probe and an attached electrical conductor(s) is disposed at the rear of the housing.

U.S. Pat. No. 7,902,848 to Eccleston, et al. discloses a reversible test probe and test probe tip. In one embodiment, a test probe tip is reversible relative to a test probe body. The reversible probe has a first probe tip at a first end and a second probe tip at a second end. The test probe body has an opening operable to receive the first probe tip and the second probe tip. When the first probe tip is positioned in the opening, the first probe tip is electrically coupled to a metal device in the test probe body. When the second probe tip is positioned in the opening, the second probe tip is electrically coupled to a metal device in the test probe body. In another embodiment, a test probe having two test probe tips is reversible relative to a test lead.

The foregoing patents reflect the current state of the art of which the present inventor is aware. Reference to, and discussion of, these patents is intended to aid in discharging Applicant's acknowledged duty of candor in disclosing information that may be relevant to the examination of claims to the present invention. However, it is respectfully submitted that none of the above-indicated patents disclose, teach, suggest, show, or otherwise render obvious, either singly or when considered in combination, the invention described and claimed herein.

SUMMARY OF THE INVENTION

The present invention provides a test instrument probe that encompasses the dual alternate action of a point or a clamp-grip within the same probe. This probe invention has approximately the same dimensions as a conventional probe, and allows either the point or clamp action to be used without the necessity of removing the probe from the user's hand. This alternate action requires only using a thumb and finger pressure to change from a point to a clamp or the clamp to a point. The below described preferred embodiment of this point/grip invention allows a clamp jaw opening of nominal ¼ inch that is usually sufficient to grip onto the leads of an electronic component such as a resistor, capacitor or integrated circuit pin.

The probes of this invention are also designed so that when not in use, the two probes can be connected together by a snap-in action that minimizes the potential loss of a probe and importantly allows the points to become safely enclosed to minimize a sharp point hazard during carrying on the person, having on a bench-top, tool-case, etc.

It is therefore an object of the present invention to provide a new and improved multifunction test instrument probe.

It is another object of the present invention to provide a new and improved test instrument probe that can perform electrical testing with a minimum of distractions caused by changing probe tips.

It is a further object of the present invention to provide a new and improved test instrument probe with a pointed tip that is capable of selectively gripping an electronic component.

Other novel features which are characteristic of the invention, as to organization and method of operation, together with further objects and advantages thereof will be better understood from the following description considered in connection with the accompanying drawings, in which preferred embodiments of the invention are illustrated by way of example. It is to be expressly understood, however, that the drawings are for illustration and description only and are not intended as a definition of the limits of the invention. The various features of novelty which characterize the invention are pointed out with particularity in the claims annexed to and forming part of this disclosure. The invention resides not in any one of these features taken alone, but rather in the particular combination of all of its structures for the functions specified.

There has thus been broadly outlined the more important features of the invention in order that the detailed description thereof that follows may be better understood, and in order that the present contribution to the art may be better appreciated. There are, of course, additional features of the invention that will be described hereinafter and which will form additional subject matter of the claims appended hereto. Those skilled in the art will appreciate that the conception upon which this disclosure is based readily may be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is neither intended to define the invention of this application, which is measured by the claims, nor is it intended to be limiting as to the scope of the invention in any way.

Certain terminology and derivations thereof may be used in the following description for convenience in reference only, and will not be limiting. For example, words such as "upward," "downward," "left," and "right" would refer to directions in the drawings to which reference is made unless otherwise stated. Similarly, words such as "inward" and "outward" would refer to directions toward and away from, respectively, the geometric center of a device or area and designated parts thereof. References in the singular tense include the plural, and vice versa, unless otherwise noted.

BRIEF DESCRIPTION OF THE DRAWINGS

The invention will be better understood and objects other than those set forth above will become apparent when consideration is given to the following detailed description thereof. Such description makes reference to the annexed drawings wherein:

FIGS. 8A-8C are views of the probes being joined together when not in use.

DETAILED DESCRIPTION OF THE INVENTION

Figure 1:
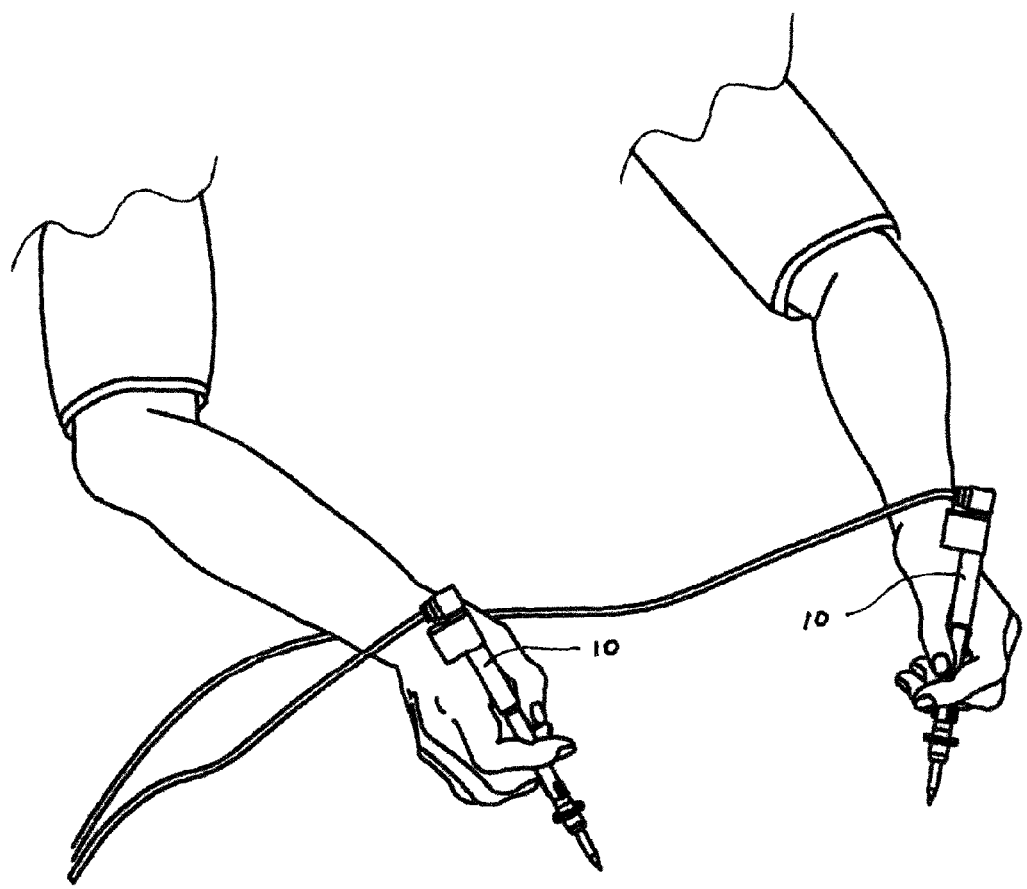
FIG. 1 is a front view of a pair of test instrument probes of this invention as held by a user.

Referring to FIGS. 1 through 8C, wherein like reference numerals refer to like components in the various views, there is illustrated therein a new and improved multifunction test instrument probe, generally denominated 10 herein.

Both of the pair of probes of this point/grip invention are preferably identical except for a color that can identify, for example, positive as red and negative as black. The insulating enclosure or body of the probe is preferably a plastic tube and the point shaft emanating from the front of the tube is covered in plastic except for the tip that contacts the DUT. The insulated enclosure also has a finger guard near the front and two buttons whose operation is described below. Contained within the rear of the plastic enclosure is a socket into which the test lead connecting to the multi-meter is plugged. Also at the rear and part of the plastic enclosure is the plastic clamp into which the second probe may be snapped-in and retained together with the first probe when the probes are not in use.

FIG. 1 is a front view of a pair of test instrument probes 10 of this invention as held by a user.

Figure 2:
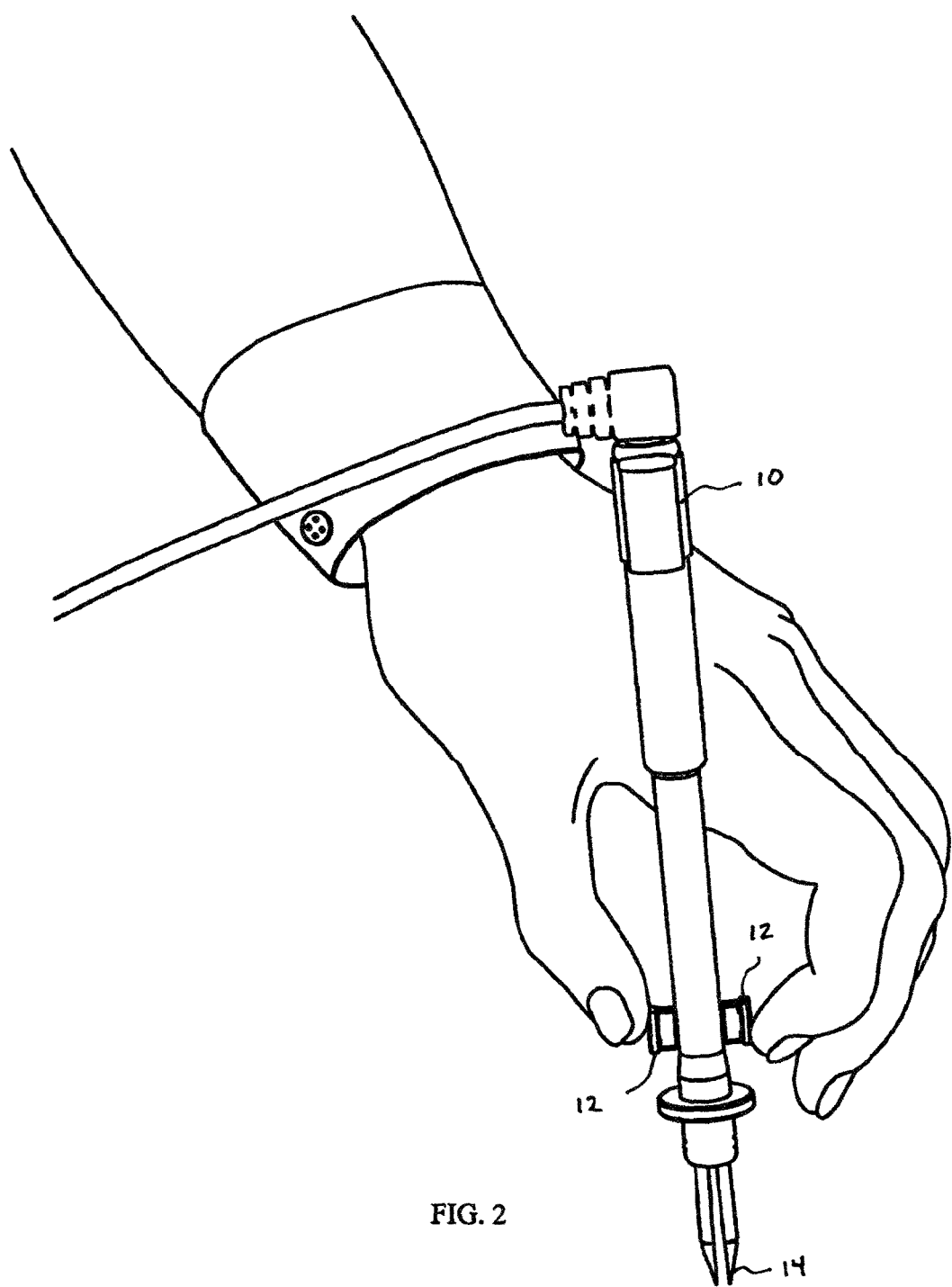
FIG. 2 is a front view of the user pressing the tabs of a probe to open the split point front.

FIG. 2 is a front view of the user pressing the tabs 12 of a probe 10 to open the split point front 14.

Figure 3A:
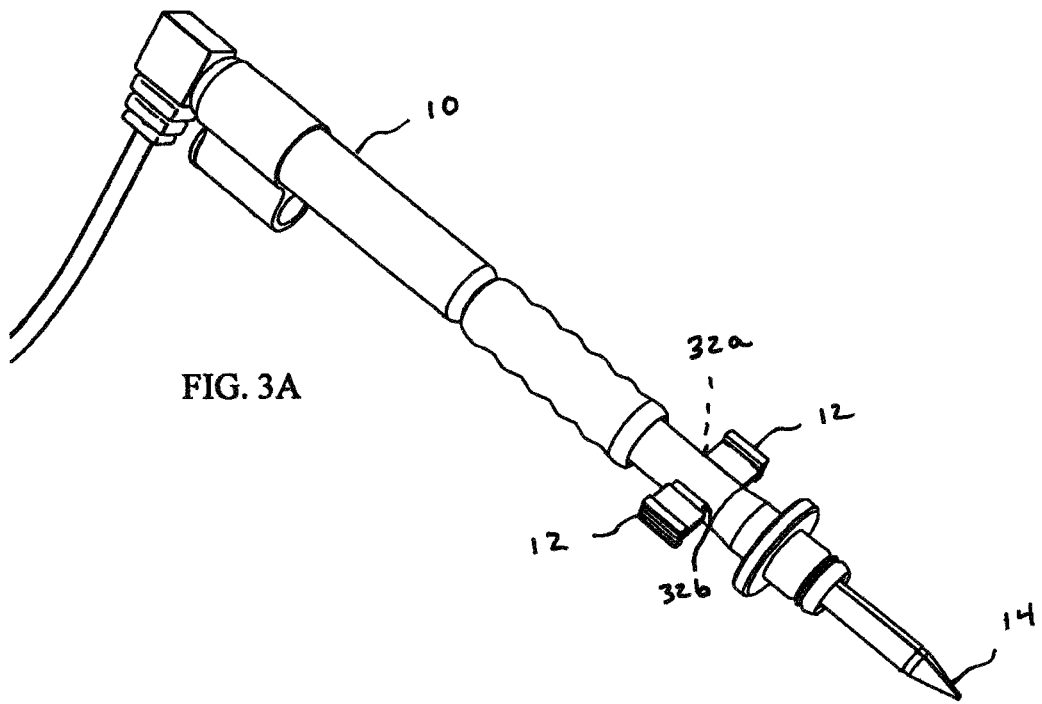
FIG. 3A is a front view of a probe in a normal (closed point) configuration.

FIG. 3A is a front view of a probe 10 in a normal (closed point 14) configuration.

Figure 3B:
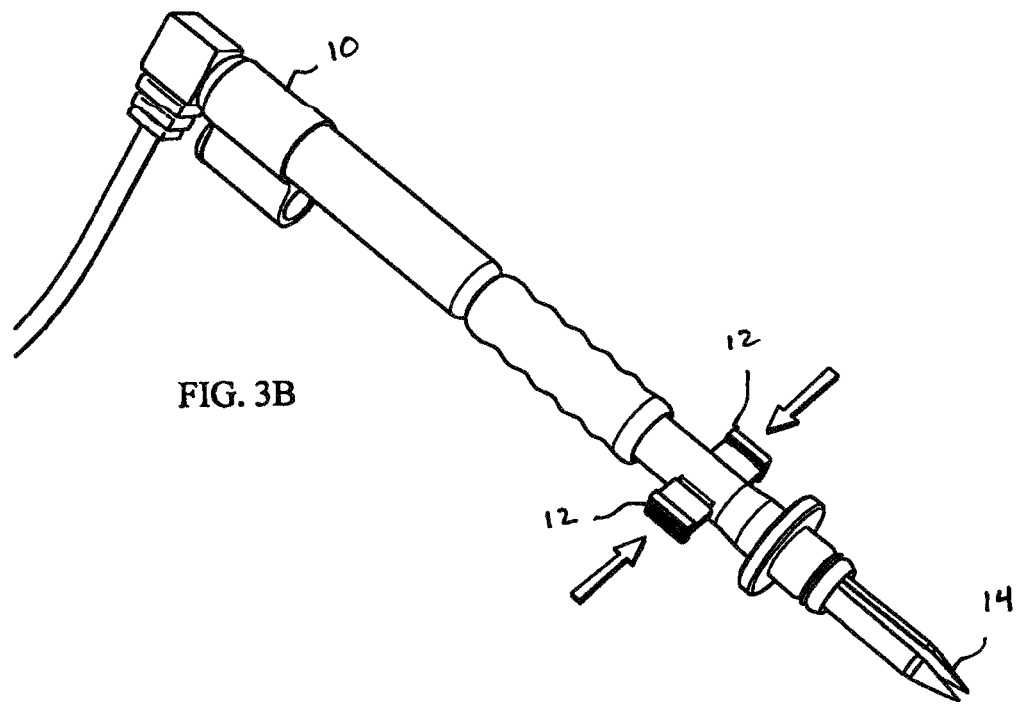
FIG. 3B is a front view of a probe in an open point configuration.

FIG. 3B is a front view of a probe 10 in an open point 14 configuration.

Figure 4:
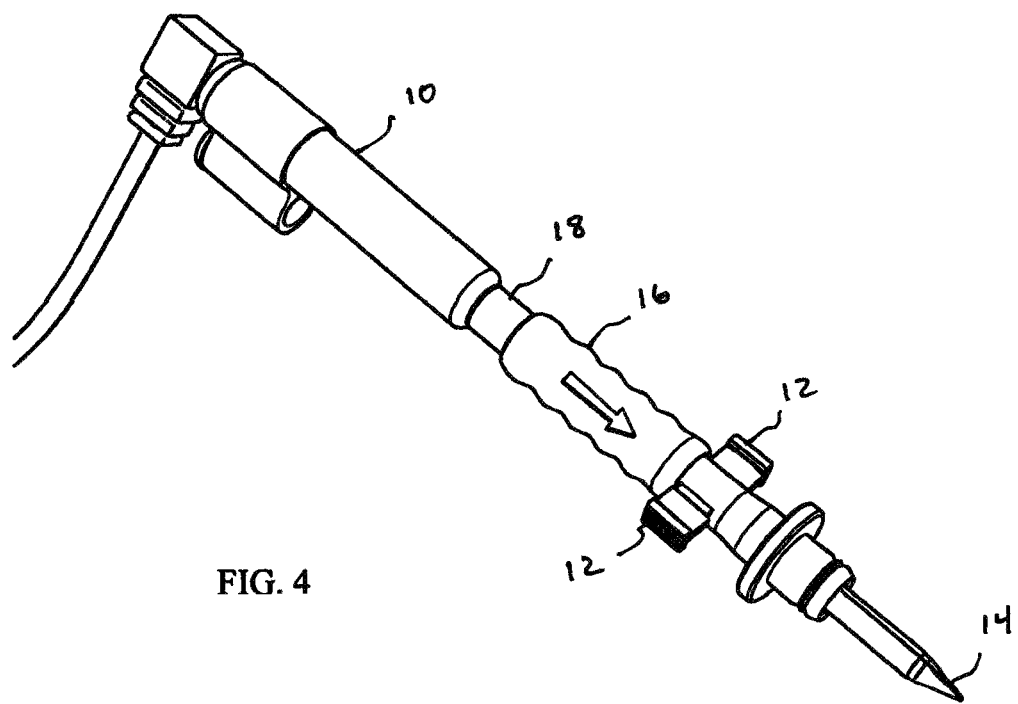
FIG. 4 is a front view of a probe that shows the finger grip on the probe body slid forward in order to lock the tabs so that they cannot be pressed and inadvertently open the point when only a closed point is required.

FIG. 4 is a front view of a probe that shows the finger grip 16 on the probe body 18 slid forward in order to lock the tabs 12 so that they cannot be pressed and inadvertently open the point 14 when only a closed point is required. Alternatively, other structural features could be incorporated on the probe body to selectively lock the tabs in the normal position.

Figure 5A:
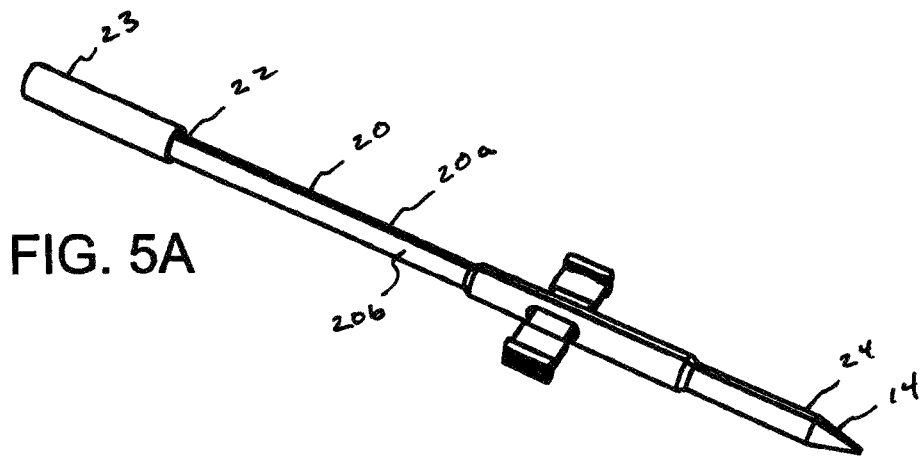
FIGS. 5A-5C are views of the interior assembly of a probe.
Figure 5B:
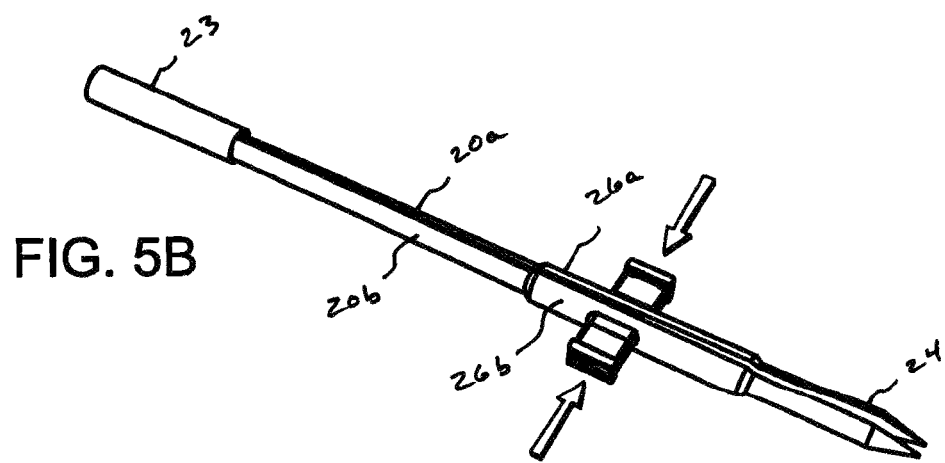
Figure 5C:
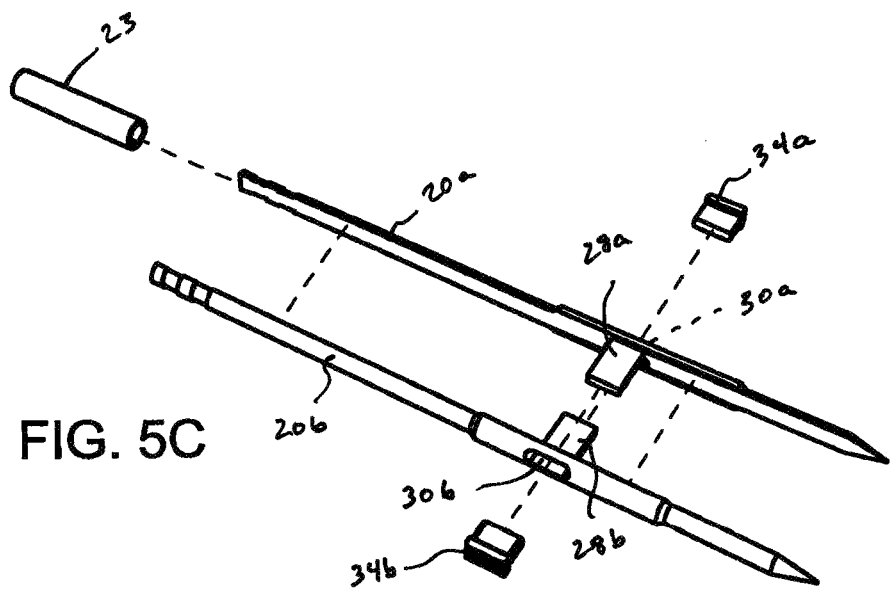

FIGS. 5A-5C are views of the interior assembly 20 of a probe and the point/grip that is enclosed within the plastic tube or body. The assembly consists of two substantially identical halves 20a, 20b of spring type of metallic material such as spring stainless steel. Each half is shaped so that the two halves placed together form a split shaft as shown. One end 22 of the shaft constitutes the rearward section and the two halves are joined such as by sleeve 23, then welding together with the test lead or socket. The forward end 24 is shaped to form a split point 14. In the area where the thumb and finger would be located on the plastic tube enclosure surrounding the shaft, the shaft has a flattened and widened section 26a, 26b on each half with an offset insulated steel tab 28a, 28b extending past the opposite half through apertures 30a, 30b.

Each tab abuts the other and is able to slide in opposite directions along each other. Each tab extends through a slot 32a, 32b (FIG. 3A) in the plastic tube enclosure and is capped with a plastic button 34a, 34b. When the two buttons are pressed together with sufficient force, each button causes the opposite half to move directly away from each other. Since the rear end 22 of the two halves of the shaft 20 is joined, the pressing together of the tabs causes the split point front 14 to open. Upon release of finger pressure on the tabs the two halves, being spring-type steel will return together to form its original point, or grip to a lead on an electronic component. Therefore the user can use the point in order to probe various places on a DUT as with a conventional point probe and then grip-on to or release from a lead simply by applying sufficient finger pressure on the buttons. The user can alternate as required between a point and a clamp and thus facilitate a test procedure in terms of accuracy, efficiency and safety.

During testing and particularly when using conventional clamps, the user may inadvertently twist the clamp when it is in position on a DUT and thus cause an occlusion or sideways separation of the clamp jaws. This can cause permanent misalignment of a conventional clamp. In order to mitigate this condition with this point/grip, the invention utilizes the tabs as described above to maintain alignment throughout normal usage with the secondary function of preventing occlusion and misalignment during mistreatment as described in the following paragraph.

When deployed, the high-strength stainless steel tab of each half slides smoothly and precisely along the opposite half, effectively locking the two halves together and maintaining their alignment. If the points are open, gripping a part, and inadvertently twisted, the strong steel tab of each opposite half will oppose the sideways movement of the other half thus greatly mitigating the possible occlusion of the two point halves.

The position of the buttons and opening of the jaws allow the user the visibility for precise positioning on a part when using the clamp action. When using the point action, the buttons are in an ergonomically beneficial position for the thumb and forefinger. This allows a hand position that accurately guides and places the point on the precise spot needed on the DUT as compared with holding the thumb and fingers on the round barrel of the tube enclosure of conventional probes. Although greater pressure is required to press the buttons in order to open the clamp than the normal pressure needed to place and hold the point onto a DUT, there are times when only the point is required. This invention provides a simple locking mechanism that locks the two point halves in place as a closed point only and no amount of pressure on the buttons or of the point on a DUT will allow the point to open when in the locked position as shown in FIG. 4.

Figure 6A:
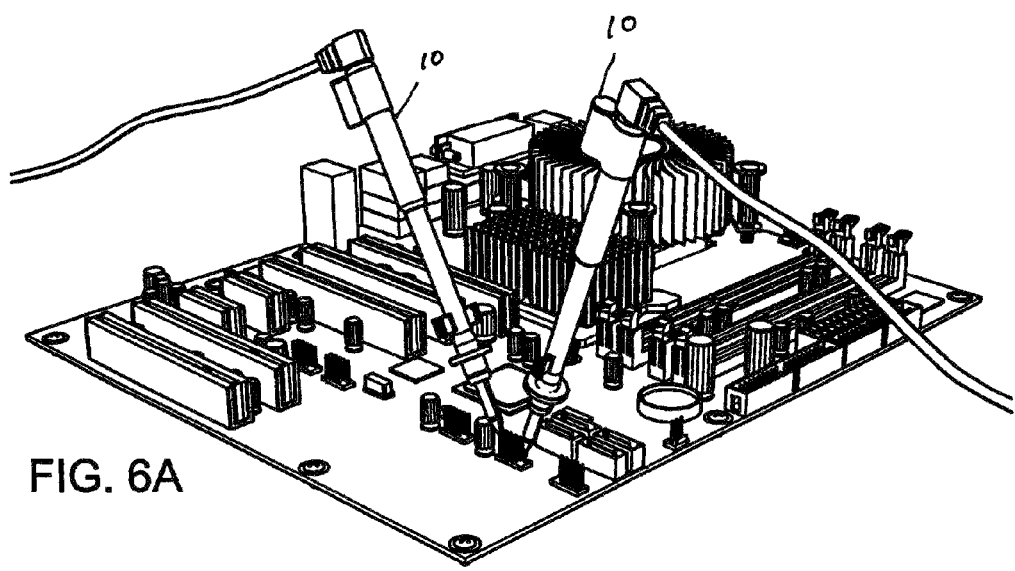
FIGS. 6A-6B are views of the probes in operation with the split points gripping the leads of an electronic component.
Figure 6B:
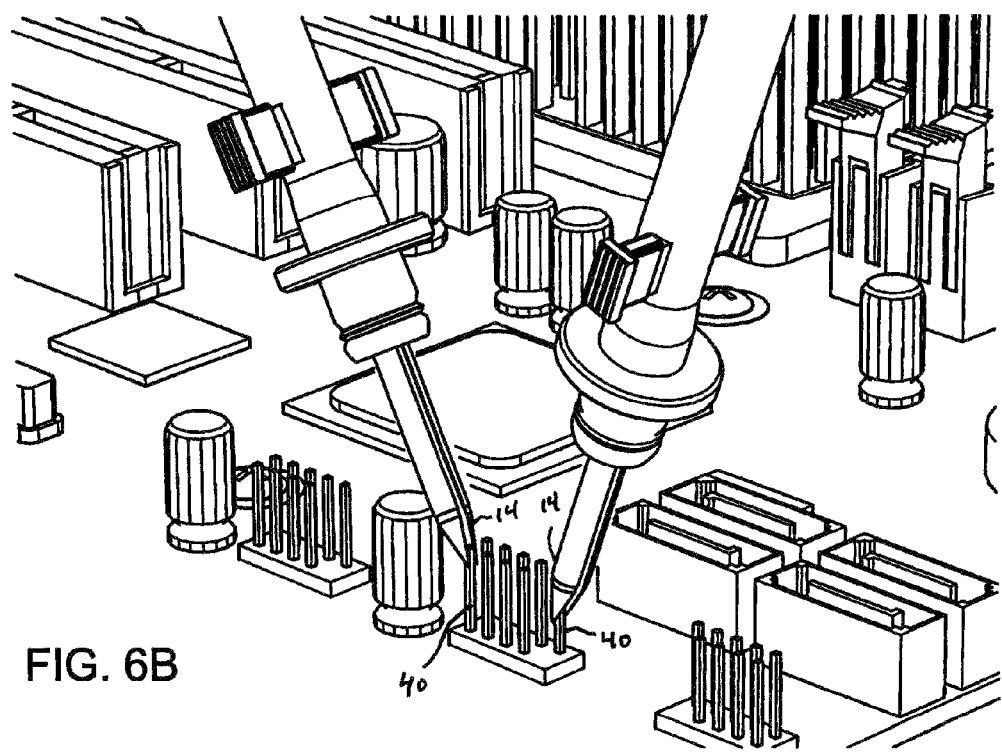

FIGS. 6A-6B are views of the probes 10 in operation with the split points 14 gripping the leads 40 of an electronic component.

Figure 7A:
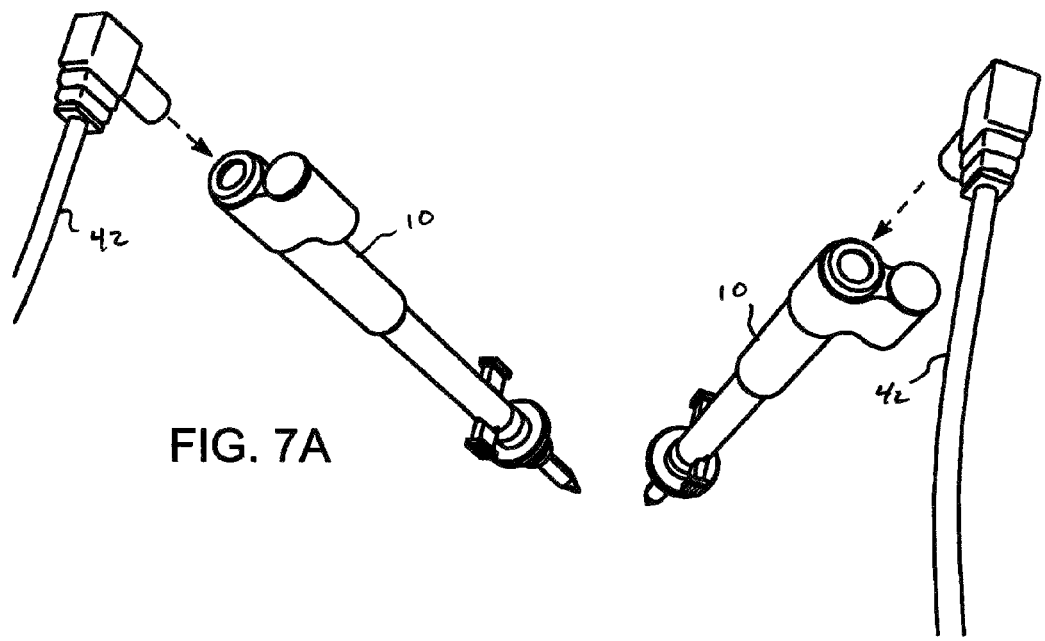
FIGS. 7A-7B are views of the probes being connected to the test leads of a multimeter.
Figure 7B:
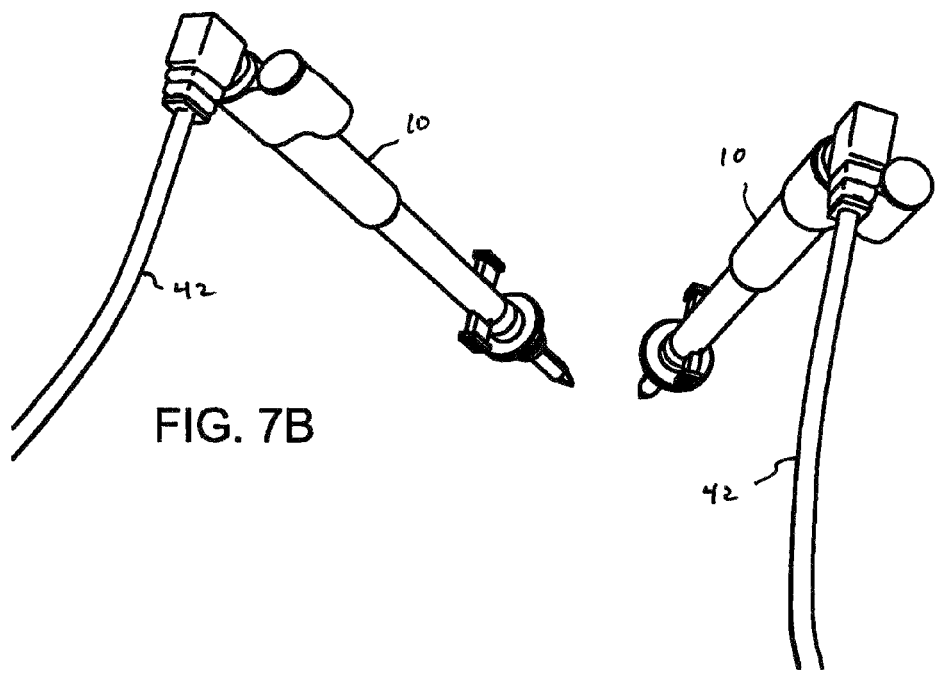

FIGS. 7A-7B are views of the probes 10 being connected to the test leads 42 of a multimeter.

FIGS. 8A-8C are views of the probes being joined together when not in use. The probes 10 are designed so that they can be connected together by a snap-in action of the point 14 of one probe into a complementary receiver or clamp 44 on the other probe that minimizes the potential loss of a probe and importantly allows the points 14 to become safely enclosed in the clamps 44 to minimize a sharp point hazard during carrying on the person, having on a bench-top, tool-case, etc.

The present invention provides much-needed and valuable versatility in the testing and maintenance of all of the electronic sectors such as communications, control, and computers. The embodiment shown in the illustrations herein is only one depiction of the basic concept of the invention's versatility, ease of use, simplicity, safety and cost effectiveness. The instrument probes in common use today have failed to evolve with changing needs and are often inadequate for modern complex electronic designs and servicing requirements. This invention contributes to the facilitation and modernization of electronics testing.

The above disclosure is sufficient to enable one of ordinary skill in the art to practice the invention, and provides the best mode of practicing the invention presently contemplated by the inventor. While there is provided herein a full and complete disclosure of the preferred embodiments of this invention, it is not desired to limit the invention to the exact construction, dimensional relationships, and operation shown and described. Various modifications, alternative constructions, changes and equivalents will readily occur to those skilled in the art and may be employed, as suitable, without departing from the true spirit and scope of the invention. Such changes might involve alternative materials, components, structural arrangements, sizes, shapes, forms, functions, operational features or the like. Therefore, the above description and illustrations should not be construed as limiting the scope of the invention, which is defined by the appended claims.

What is claimed as invention is:

1. A test instrument probe comprising:
   a body;
   a split shaft assembly in said body, said split shaft assembly including a pair of substantially identical shaft halves normally biased together to form a point at a front end thereof, each shaft halve including a tab portion extending through an aperture in the other shaft halve, wherein when said tab portions are pressed together, said shaft halves are urged apart and said point opens to form a clamp for releasable capture of a lead on a device under test, and when said tab portions are released, said shaft halves return together to form a point.

2. The test instrument probe of claim 1 wherein said shaft halves are joined at a rear end thereof.

3. The test instrument probe of claim 1 wherein said split shaft assembly is connected to a multimeter test lead.

4. The test instrument probe of claim 1 wherein said body includes means for selectively locking said shaft halves in a closed position.

5. The test instrument probe of claim 1 wherein said body includes a finger sleeve for selectively preventing said tab portions from being pressed together.

6. The test instrument probe of claim 1 wherein said body comprises an insulating enclosure for said split shaft assembly.

7. The test instrument probe of claim 1 wherein said body comprises a plastic tube.

8. The test instrument probe of claim 1 wherein said split shaft assembly is constructed of a spring type of metallic material.

9. The test instrument probe of claim 1 wherein said body includes a socket for connection to a test lead.

10. The test instrument probe of claim 1 wherein said tab portions are capped with a plastic button.

11. The test instrument probe of claim 1 wherein said body includes a clamp for releasable capture of a point of a complementary test instrument probe.

\* \* \* \* \*